United States Patent
Tsai et al.

(10) Patent No.: US 7,542,289 B2
(45) Date of Patent: Jun. 2, 2009

(54) AIRFLOW-GUIDING DEVICE AND COMPUTER HAVING SAME

(75) Inventors: Ho-Chin Tsai, Taipei Hsien (TW); Sheng-Hung Lee, Taipei Hsien (TW); Li-Ping Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/845,102

(22) Filed: Aug. 27, 2007

(65) Prior Publication Data

US 2009/0034190 A1  Feb. 5, 2009

(30) Foreign Application Priority Data

Aug. 3, 2007  (CN) .......................... 2007 2 0200774

(51) Int. Cl.
  *H05K 7/20* (2006.01)
(52) U.S. Cl. ........................ 361/695; 361/687; 361/694; 454/184
(58) Field of Classification Search ......... 361/694–695, 361/687; 454/184
  See application file for complete search history.

(56) References Cited

U.S. PATENT DOCUMENTS

| | | | | |
|---|---|---|---|---|
| 5,410,448 A | * | 4/1995 | Barker et al. ................ 361/695 |
| 5,774,330 A | * | 6/1998 | Melton et al. ................ 361/683 |
| 6,018,458 A | * | 1/2000 | Delia et al. .................. 361/690 |
| 6,115,250 A | * | 9/2000 | Schmitt ....................... 361/695 |
| 6,155,920 A | * | 12/2000 | Pan et al. .................... 454/184 |
| 6,169,656 B1 | | 1/2001 | Pei et al. |
| 6,771,499 B2 | * | 8/2004 | Crippen et al. .............. 361/687 |
| 6,924,977 B2 | * | 8/2005 | Bestwick et al. ............ 361/687 |
| 7,269,006 B2 | * | 9/2007 | Miyamoto et al. .......... 361/687 |
| 7,397,660 B2 | * | 7/2008 | Strmiska et al. ............. 361/687 |
| 2007/0236882 A1 | * | 10/2007 | Chen .......................... 361/695 |
| 2008/0117589 A1 | * | 5/2008 | Carrera et al. .............. 361/687 |
| 2008/0151490 A1 | * | 6/2008 | Fan et al. .................... 361/687 |

* cited by examiner

*Primary Examiner*—Gregory D Thompson
(74) *Attorney, Agent, or Firm*—Frank R. Niranjan

(57) ABSTRACT

An airflow-guiding device for guiding airflow to heat generating components includes an airflow-guiding shield and at least one airflow-guiding piece rotatable in the airflow-guiding shield. The airflow-guiding piece includes a guiding surface guiding airflow, and a blocking surface blocking airflow. An airflow-guiding position where the guiding surface faces the heat generating components guides airflow thereto, and an airflow-blocking position where the blocking surface faces the airflow blocks the airflow. The airflow-guiding piece rotates between the airflow-guiding position and the airflow-blocking position.

7 Claims, 5 Drawing Sheets

AIRFLOW-GUIDING DEVICE AND COMPUTER HAVING SAME

BACKGROUND

1. Field of the Invention

The present invention relates to an airflow-guiding device, and more particularly to an airflow-guiding device in a server.

2. Description of Related Art

In the computer industry, different kinds of servers are developed to satisfy different kinds of demands. For example, network servers provide network service, storage servers are used to store a mass of data, operation servers possess quick operation function, and so on. Thus, a plurality of hard disks is installed in the storage servers, and a plurality of central processing units is secured on motherboards in the operation servers, which generate a large amount of heat in the servers. For dissipating heat in each server, a fan bracket with a plurality of fans mounted therein is installed in the server to cool the server.

In the server, different components have different heat dissipating needs. Some components need air ducts for guiding airflow. However, these air ducts are immovably mounted in the server, and cannot be adjusted to accommodate changes in layout of components in the server. For example, even if a heat generating component is removed from the server, a corresponding air duct will remain in place.

What is needed, therefore, is to provide an adjustable airflow-guiding device, which has a simple structure.

SUMMARY

An airflow-guiding device for guiding airflow to heat generating components includes an airflow-guiding shield and at least one airflow-guiding piece rotatable in the airflow-guiding shield. The airflow-guiding piece includes a guiding surface for guiding airflow, and a blocking surface for blocking airflow. The airflow-guiding device rotatable from an airflow-guiding position, where the guiding surface faces the heat generating components and guides airflow thereto, to an airflow-blocking position, where the blocking surface faces the heat generating components and blocks airflow thereto.

Other advantages and novel features of the present invention will become more apparent from the following detailed description of a preferred embodiment when taken in conjunction with the accompanying drawings, in which:

DETAILED DESCRIPTION

Figure 1:
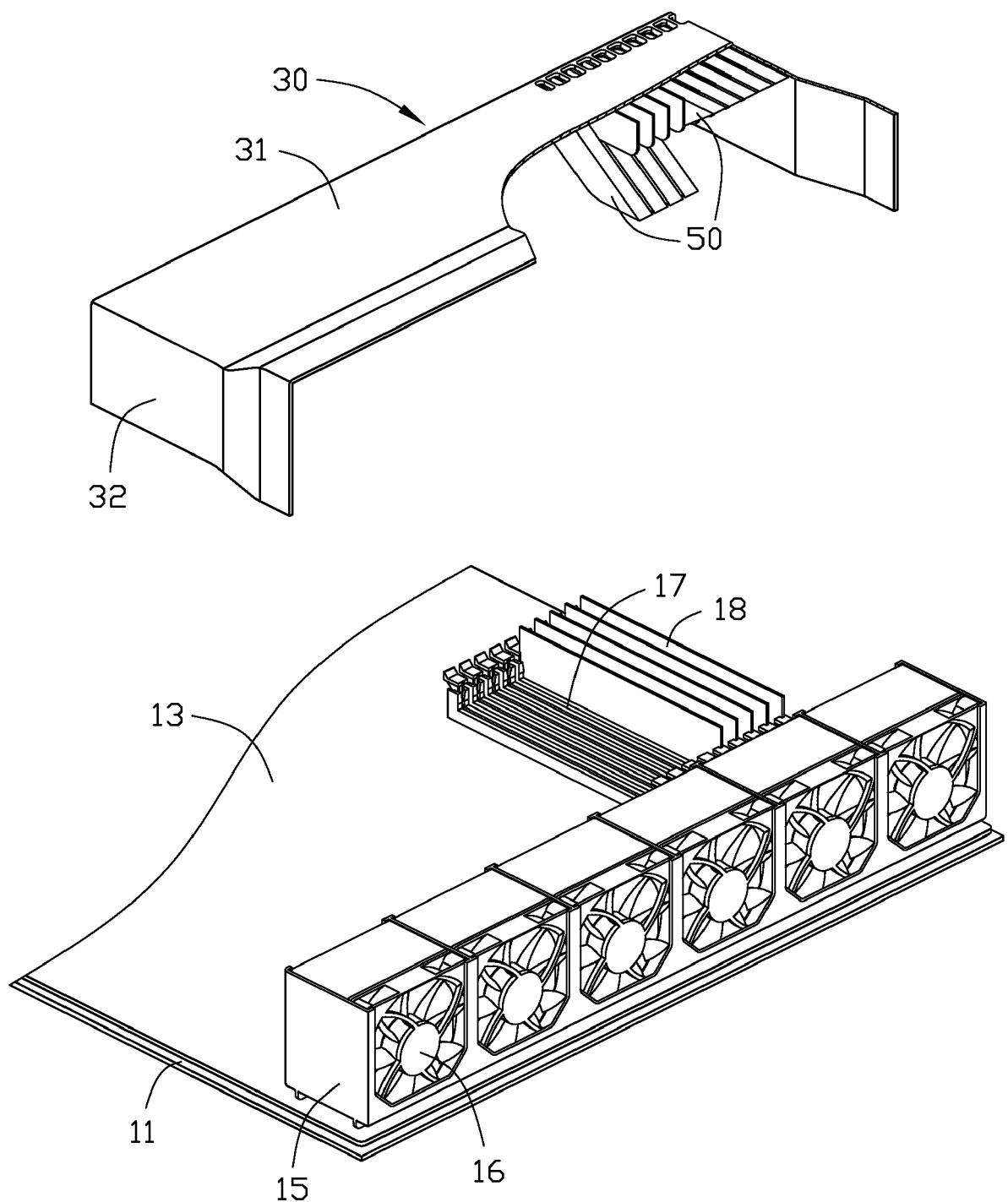
FIG. 1 is an isometric view of an airflow-guiding device and a motherboard of a server.

Referring to FIG. 1, an airflow-guiding device of an embodiment of the present invention includes an airflow-guiding shield 30 and a plurality of airflow-guiding pieces 50 secured in the shield 30, for guiding airflow in a server.

A bottom wall 11 in the server fixes a motherboard 13. A fan holder 15 is located on the motherboard 13. A plurality of fans 16 is secured in the fan holder 15, for dissipating heat generated by electronic devices on the motherboard 13. A plurality of parallel expansion slots 17 is set on the motherboard 13. A plurality of expansion cards 18 is received in the expansion slots 17.

Figure 2:
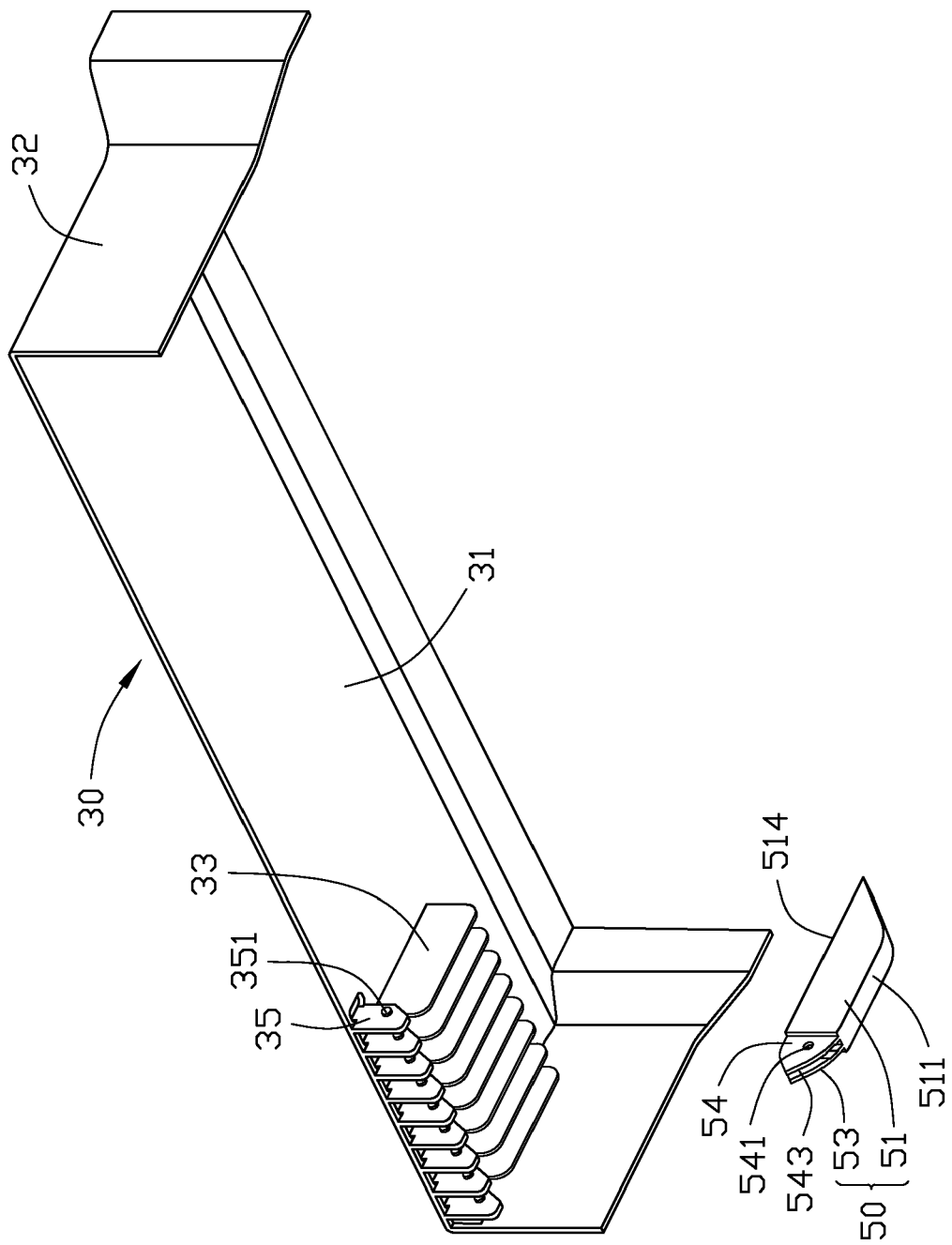
FIG. 2 is an exploded view of the airflow-guiding device of FIG. 1, but viewed from another aspect.

Referring to FIG. 2, the shield 30 includes a top plate 31 and two side plates 32 extending perpendicularly and downwardly from two side edges of the top plate 31 respectively. Thereby an airflow-guiding channel is formed between the top plate 31 and the two side plates 32. The length of the top plate 31 is approximately equal to the length of the fan holder 15. The shield 30 guides airflow generated by all the fans 16 in the fan holder 15.

A plurality of fixing pieces 35 is formed on the underside of the top plate 31 of the shield 30, corresponding to the expansion slots 17 on the motherboard 13. A pair of pivots 351 is formed on two sides of each fixing piece 35 respectively. A partition 33 is formed between each two adjacent fixing pieces 35 respectively. Each airflow-guiding piece 50 can be pivotally mounted on each fixing piece 35. Each airflow-guiding piece 50 includes an airflow-guiding portion 51 and a pivot portion 53. An underside of each guiding portion 51 forms a streamline guiding surface 511 thereon. A blocking surface 514 is formed on the top of each guiding portion 51. First part of the guiding surface 511 is parallel to the blocking surface 514, and second part of the guiding surface 511 is extended upwardly and slantingly to a free end of the blocking surface 514. The pivot portions 53 each include two parallel pieces 54 extending from distal ends of the guiding portions 51. A hole 541 is defined in each piece 54, corresponding to the pivot 351 of the fixing piece 35. A space 543 is defined between the pieces 54 of each airflow-guiding piece 50.

Figure 3:
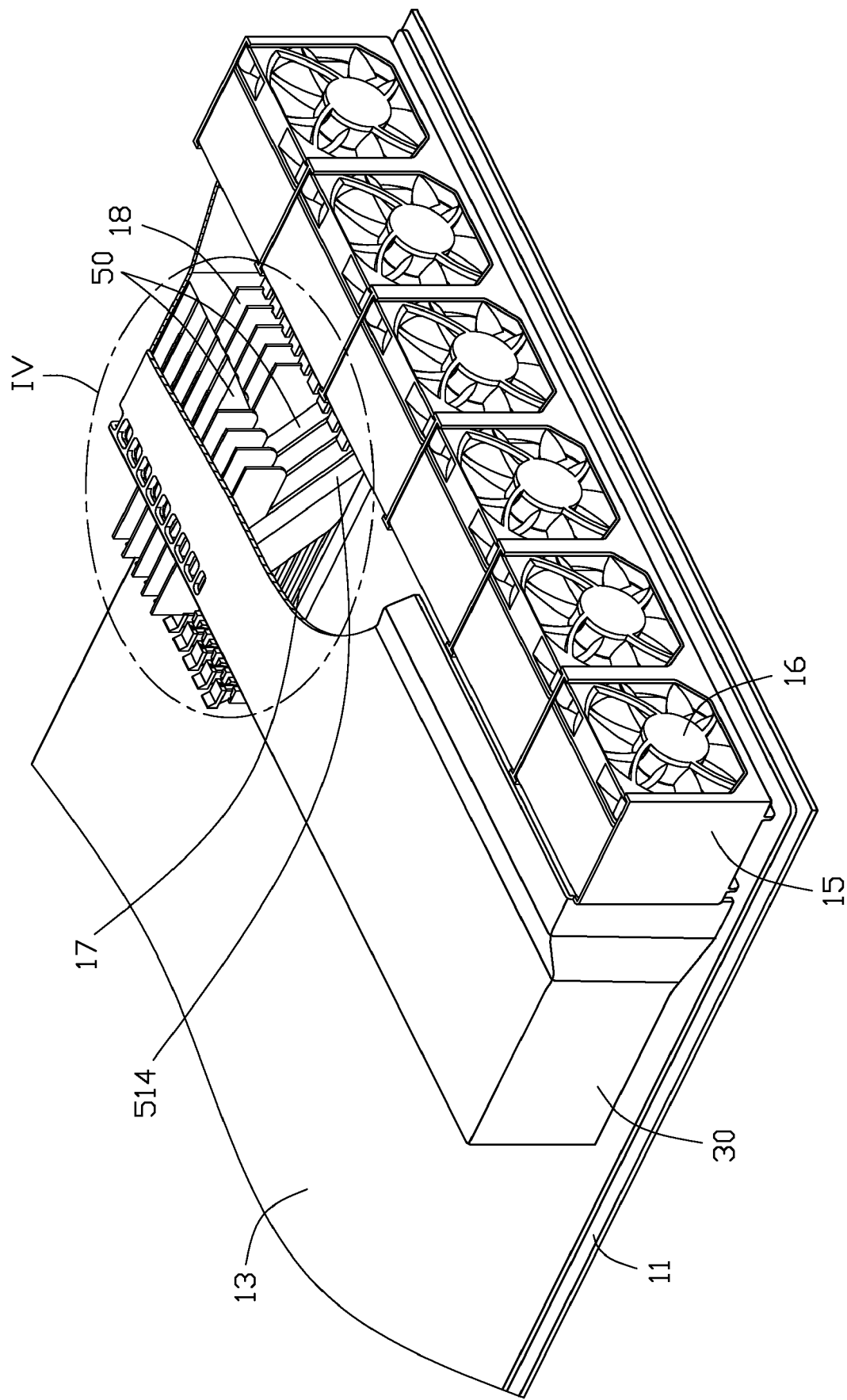
FIG. 3 is an assembled view of FIG. 1.
Figure 4:
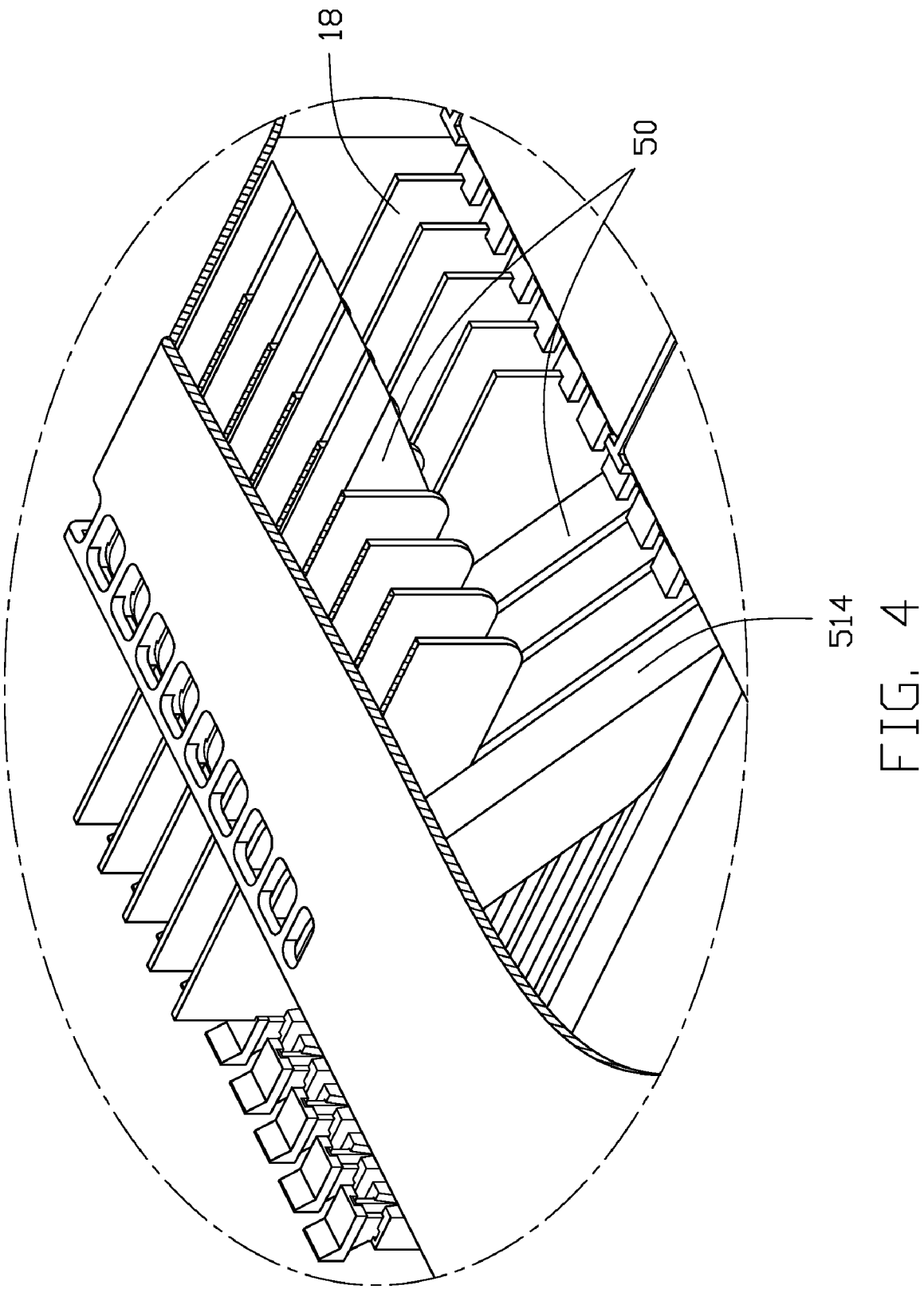
FIG. 4 is an enlarged view of an encircled portion IV of FIG. 3.
Figure 5:
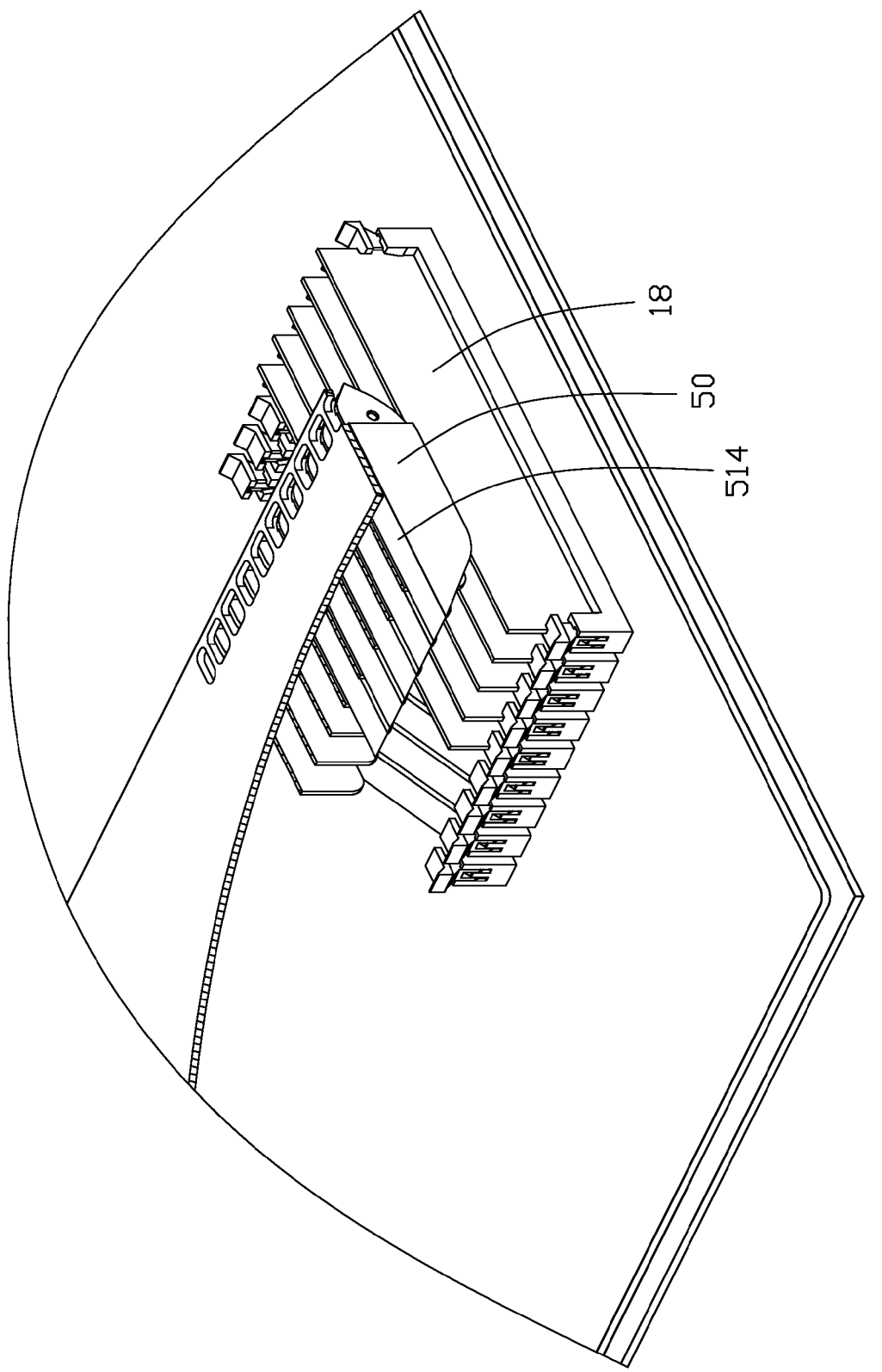
FIG. 5 is similar to FIG. 3 without fans.

Referring also to FIGS. 3, 4 and 5, in assembly, the fixing pieces 35 of the shield 30 are inserted into the spaces 543 of the airflow-guiding pieces 50. The pivots 351 of the fixing pieces 35 are inserted into the holes 541 of the corresponding pieces 54. Then the airflow-guiding pieces 50 are pivotally mounted on the fixing pieces 35. The airflow-guiding pieces 50 rotate between an airflow-guiding position where airflow is directed to heat generating components and an airflow-blocking position where airflow is blocked. Adjacent airflow-guiding pieces 50 are separated by one of the partitions 33. The shield 30 is secured in the server and located in front of the fan holder 15. Thereby, the shield 30 guides airflow generated by the fans 16. The airflow-guiding pieces 50 are located above the expansion slots 17 on the motherboard 11. Each expansion channel 17 corresponds to one of the airflow-guiding pieces 50. Some of the expansion slots 17 of the motherboard 11 receive the expansion cards 18, and others do not. Each airflow-guiding piece 50 of the airflow-guiding shield 30 can be adjusted according to the status of the corresponding expansion channel 17. For example, if an expansion channel 17 receives one of the expansion cards 18, the corresponding airflow-guiding piece 50 above the expansion channel 17 rotates upwards to the airflow-guiding position, so that the guiding surface 511 faces the expansion card 18, thereby guiding airflow generated by the fan 16 to the expansion card 18. If an expansion slot 17 does not receive one of the expansion cards 18, the corresponding airflow-guiding piece 50 above the expansion slot 17 rotates downwards to the airflow-blocking position. The blocking surface 514 of the airflow-guiding piece 50 faces the fan 16, thereby blocking airflow generated by the fan 16 away from the expansion slot 17 without the expansion card 18. Then the airflow flows to other heat generating components, for aiding in the dissipation of heat.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A computer, comprising:
   a motherboard with a heat generating component mounted thereon;
   at least one fan for creating a cooling airflow toward the heat generating component; and
   an airflow-guiding shield located above the heat generating component, the airflow-guiding shield defining an airflow-guiding channel therein adapted for guiding the airflow created by the fan to the heat generating component in a first direction via the channel, the airflow-guiding shield having an airflow-guiding piece pivotally mounted in the airflow-guiding channel about a pivot extending in a second direction perpendicular to the first direction, the airflow-guiding piece comprising a guiding surface adapted for guiding the airflow, and a blocking surface adapted for blocking the airflow, the airflow-guiding piece being rotatable in the airflow-guiding channel between an airflow-guiding position where the guiding surface is oriented to be substantially parallel to the first direction to allow the airflow to pass therethrough, and an airflow-blocking position where the blocking surface is oriented to face the fan and block the airflow passing therethrough;
   wherein the airflow-guiding piece comprises an airflow-guiding portion, a top of the airflow-guiding portion serves as the blocking surface thereon, an underside of the airflow-guiding portion serves as the guiding surface thereon, a first part of the guiding surface is parallel to the blocking surface, and a second part of the guiding surface is extended upwardly and slantingly to a free end of the blocking surface.

2. The computer as described in claim 1, wherein when the airflow-guiding piece is at the airflow-guiding position, the guiding surface is parallel to the first direction, the first part of the guiding surface adjacent to the fan faces the fan, and the second part of the guiding surface away from the fan faces the heat generating component, and when the airflow-guiding piece is at the airflow-blocking position, the blocking surface faces the fan to block the airflow flowing in the first direction.

3. The computer as described in claim 1, wherein the airflow-guiding piece comprises a pivot portion with two parallel pieces, a space is formed between the two pieces, a fixing piece is formed on the airflow-guiding shield to be inserted into the space to pivotally mount the airflow-guiding piece on the fixing piece.

4. An airflow-guiding device for guiding airflow, the airflow-guiding device comprising:
   an airflow-guiding shield; and
   a plurality of airflow-guiding pieces pivotally mounted on the airflow-guiding shield, each corresponding airflow-guiding piece corresponding to a mounting location of a heat generating component, each of the airflow-guiding pieces rotating on the airflow-guiding shield in such a manner that when the corresponding mounting location receives a heat generating component, the airflow-guiding piece rotates to an airflow-guiding position for directing airflow to the heat generating component, and when the corresponding mounting location has not received a heat generating component, the corresponding airflow-guiding piece rotates to an airflow-blocking position for blocking airflow;
   wherein each airflow-guiding piece comprises an airflow-guiding portion, a top of the airflow-guiding portion serves as a blocking surface thereon, an underside of the airflow-guiding portion serves as a guiding surface thereon, a first part of the guiding surface is parallel to the blocking surface, and a second part of the guiding surface is extended upwardly and slantingly to a free end of the blocking surface, an angle exists between the second part and the blocking surface for guiding airflow.

5. The airflow-guiding device as described in claim 4, wherein each airflow-guiding piece is located at the airflow-guiding position where the guiding surface faces the heat generating component to direct airflow, and each airflow-guiding piece is located at the airflow-blocking position where the free end of the blocking surface faces resists against the mounting location of the heat generating component to block airflow.

6. The airflow-guiding device as described in claim 4, wherein each airflow-guiding piece comprises a pivot portion with two parallel pieces, a space is formed between the two pieces, a fixing piece is formed on the airflow-guiding shield, corresponding to each airflow-guiding piece, the fixing piece is inserted into the space, thereby each airflow-guiding piece is pivotally mounted on the fixing piece.

7. The airflow-guiding device as described in claim 4, wherein a partition is formed between the adjacent airflow-guiding pieces, for separating the adjacent airflow-guiding pieces.

* * * * *